United States Patent
Yen et al.

(10) Patent No.: US 11,610,834 B2
(45) Date of Patent: Mar. 21, 2023

(54) LEADFRAME INCLUDING CONDUCTIVE PILLAR OVER LAND OF CONDUCTIVE LAYER

(71) Applicant: Advanced Semiconductor Engineering, Inc., Kaohsiung (TW)

(72) Inventors: You-Lung Yen, Kaohsiung (TW); Bernd Karl Appelt, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 415 days.

(21) Appl. No.: 16/655,178

(22) Filed: Oct. 16, 2019

(65) Prior Publication Data

US 2021/0118775 A1  Apr. 22, 2021

(51) Int. Cl.
*H01L 23/495* (2006.01)
*H01L 23/00* (2006.01)

(52) U.S. Cl.
CPC .... *H01L 23/4952* (2013.01); *H01L 23/49534* (2013.01); *H01L 23/49541* (2013.01); *H01L 23/49575* (2013.01); *H01L 24/14* (2013.01)

(58) Field of Classification Search
CPC ........... H01L 23/4952; H01L 23/49534; H01L 23/49541; H01L 23/49575; H01L 24/14
See application file for complete search history.

(56) References Cited

U.S. PATENT DOCUMENTS

| | | | |
|---|---|---|---|
| 7,087,986 B1* | 8/2006 | Bayan | H01L 23/49503 257/676 |
| 2014/0227832 A1* | 8/2014 | Wang | H01L 21/565 438/124 |
| 2017/0005029 A1* | 1/2017 | Bang | H01L 23/49827 |
| 2019/0067212 A1* | 2/2019 | Cadag | H01L 23/4952 |
| 2019/0080991 A1* | 3/2019 | Vincent | H01L 23/49517 |

FOREIGN PATENT DOCUMENTS

| | | | | |
|---|---|---|---|---|
| KR | 101647587 B1 * | 8/2016 | ....... | H01L 23/49541 |
| WO | WO-2004015770 A1 * | 2/2004 | ......... | H01L 21/4857 |

* cited by examiner

*Primary Examiner* — Matthew E Warren

(74) *Attorney, Agent, or Firm* — Foley & Lardner LLP

(57) ABSTRACT

A leadframe includes a first conductive layer, a plurality of conductive pillars and a first package body. The first conductive layer has a first surface and a second surface opposite to the first surface. The plurality of conductive pillars are disposed on the first surface of the first conductive layer. The first package body is disposed on the first surface of the first conductive layer and covers the conductive pillars. The conductive pillars and the first conductive layer are integratedly formed.

11 Claims, 15 Drawing Sheets

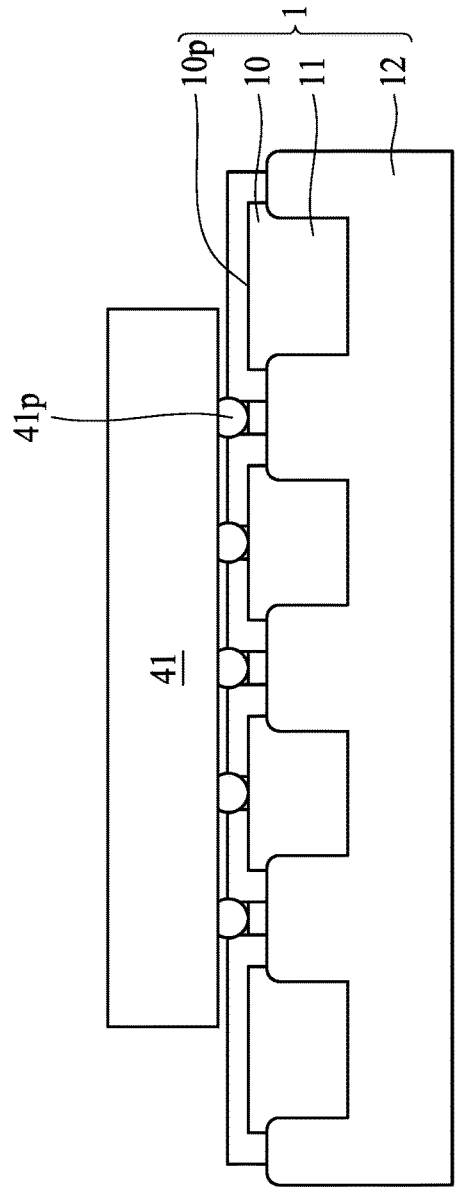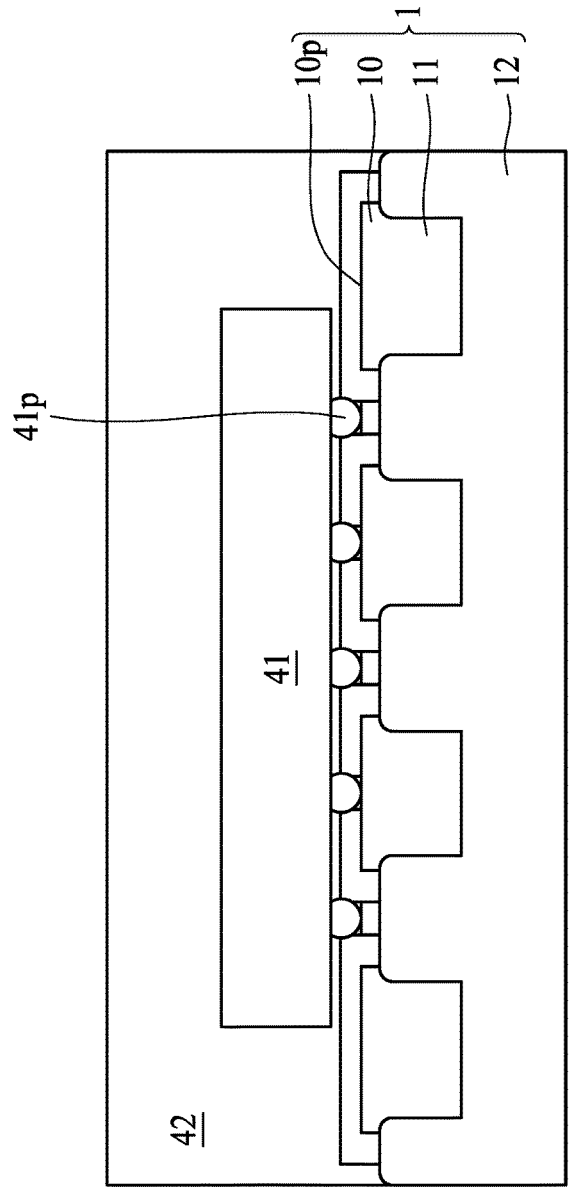

LEADFRAME INCLUDING CONDUCTIVE PILLAR OVER LAND OF CONDUCTIVE LAYER

BACKGROUND

1. Technical Field

The present disclosure relates to a semiconductor device package and a method of making the same, and to a semiconductor device package including a leadframe and a manufacturing method thereof.

2. Description of the Related Art

Leadframes are used in many semiconductor device packages because of their high reliability. In general, the thickness of a leadframe is relatively thin, and a molding compound may be used to cover the leadframe to improve the support capability of the leadframe. In a comparative method to form a leadframe, a metal plate is provided, a plurality of conductive pillars are formed on the metal plate by plating, and then a molding compound is formed on the metal plate to cover the conductive pillars. However, due to the constraint of the plating process, voids may be formed within the conductive pillars, and the conductive pillars may have various heights. This may adversely affect the electrical performance of the leadframe.

SUMMARY

In some embodiments, according to one aspect, a leadframe includes a first conductive layer, a plurality of conductive pillars and a first package body. The first conductive layer has a first surface and a second surface opposite to the first surface. The plurality of conductive pillars are disposed on the first surface of the first conductive layer. The first package body is disposed on the first surface of the first conductive layer and covers the conductive pillars. The conductive pillars and the first conductive layer are integratedly formed.

In some embodiments, according to another aspect, a semiconductor device package includes a leadframe and an electronic component. The leadframe includes a first conductive layer, a conductive pillar and a first package body. The first conductive layer has a first surface and a second surface opposite to the first surface. The conductive pillar is disposed on the first surface of the first conductive layer. The conductive pillar has a curved lateral surface connected to the first surface of the first conductive layer. The first package body is disposed on the first surface of the first conductive layer and covers the conductive pillar. The electronic component is disposed on the second surface of the first conductive layer of the leadframe and electrically connected to the leadframe.

In some embodiments, according to another aspect, a method of manufacturing a semiconductor device package includes (a) providing a leadframe as recited in paragraph [0003], in which the conductive pillars are fully covered by the first package body; (b) electrically connecting an electronic component to the conductive layer of the leadframe; (c) forming a third package body on the leadframe to cover the electronic component; (d) removing a portion of the first package body to expose a surface of each of the conductive pillars facing away from the electronic component; and (e) disposing electrical contacts on the surfaces of the conductive pillars exposed from the first package body.

BRIEF DESCRIPTION OF THE DRAWINGS

FIG. 9A, FIG. 9B, FIG. 9C and FIG. 9D illustrate a method for manufacturing a semiconductor device package in accordance with some embodiments of the present disclosure.

Figure 1:
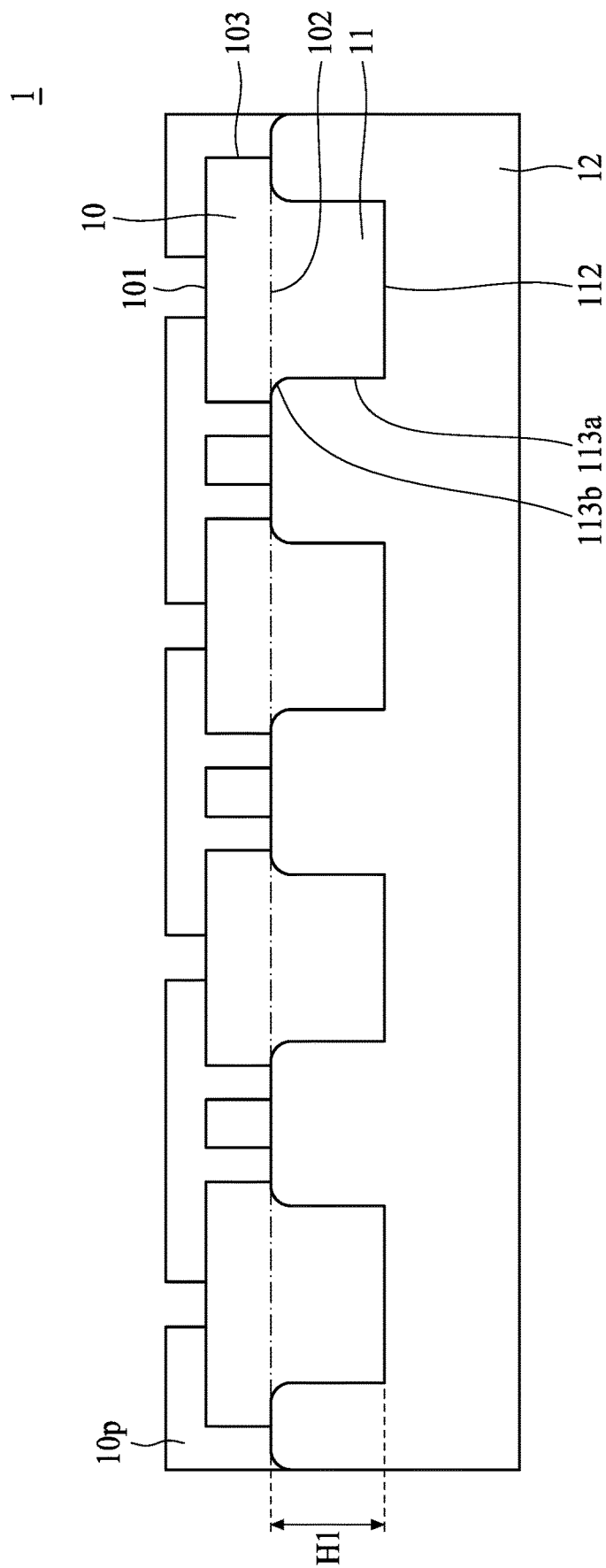
FIG. 1 illustrates a cross-sectional view of a leadframe in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of a leadframe 1 in accordance with some embodiments of the present disclosure. The leadframe 1 includes a conductive layer 10, one or more conductive pillars 11 and a package body 12.

The conducive layer 10 is a patterned conductive layer. The conductive layer 10 is or includes, copper or a copper alloy. The conductive layer has a surface 101, a surface 102 opposite to the surface 101 and a lateral surface 103 extending between the surfaces 101 and 102. A protection layer 10p (e.g., solder mask or solder resist) may cover the surface 101 and the lateral surface 103 of the conductive layer 10. A portion of the surface 101 of the conductive layer 10 is exposed from the protection layer 10p for electrical connections (e.g., to provide electrical connections between an electronic component and the leadframe 1). In some embodiments, a thickness of the conductive layer 10 is in a range from about 3 micrometer (μm) to about 5 μm. In some embodiments, the line/space (L/S) of the conductive layer 10 is equal to or less than 15/15 μm.

The conductive pillars 11 are disposed on the surface 102 of the conductive layer 10. In some embodiments, the conductive pillars 11 and the conductive layer 10 include the same material. In some embodiments, the conductive pillars 11 and the conductive layer 10 are integratedly formed. For example, the conductive pillars 11 and the conductive layer 10 are formed in one piece. For example, there is no connection interface between the conductive pillars 11 and the conductive layer 10. In some embodiments, the conductive pillars 11 include a substantially uniform height H1 (e.g., a distance between the surface 102 of the conductive layer 10 and a surface 112 of the conductive pillar 11). For example, the height of one of the conductive pillar 11 is substantially the same as the height of any other conductive pillars 11.

The conductive pillar 11 has lateral surfaces 113a and 113b. The lateral surface 113a is straight and substantially perpendicular to the surface 112 of the conductive pillar 11. The lateral surface 113b is connected between the lateral surface 113a of the conductive pillar 11 and the surface 102 of the conductive layer 10. In some embodiments, the lateral surface 113b has a curve. For example, the lateral surface 113b is inwardly curved.

The package body 12 is disposed on the surface 102 of the conductive layer 10 to cover or encapsulate the conductive pillars 11. The lateral surface 103 of the conductive layer 10 is exposed from the package body 12. In some embodiments, the package body 12 includes an epoxy resin including fillers (e.g., $SiO_2$ fillers), a molding compound (e.g., an epoxy molding compound or other molding compound), a polyimide, a phenolic compound or material, a material with a silicone dispersed therein, or a combination thereof.

As mentioned above, conductive pillars of the comparative leadframe are formed by plating. However, due to the constraint of the plating process, voids may be formed within the conductive pillars, and the conductive pillars may have various heights, which would adversely affect the electrical performance of the leadframe. In accordance with the embodiments as shown in FIG. 1, the conductive pillars 11 are void-free and have the substantially uniform height H1, the electrical performance of the leadframe 1 can be improved.

Figure 2:
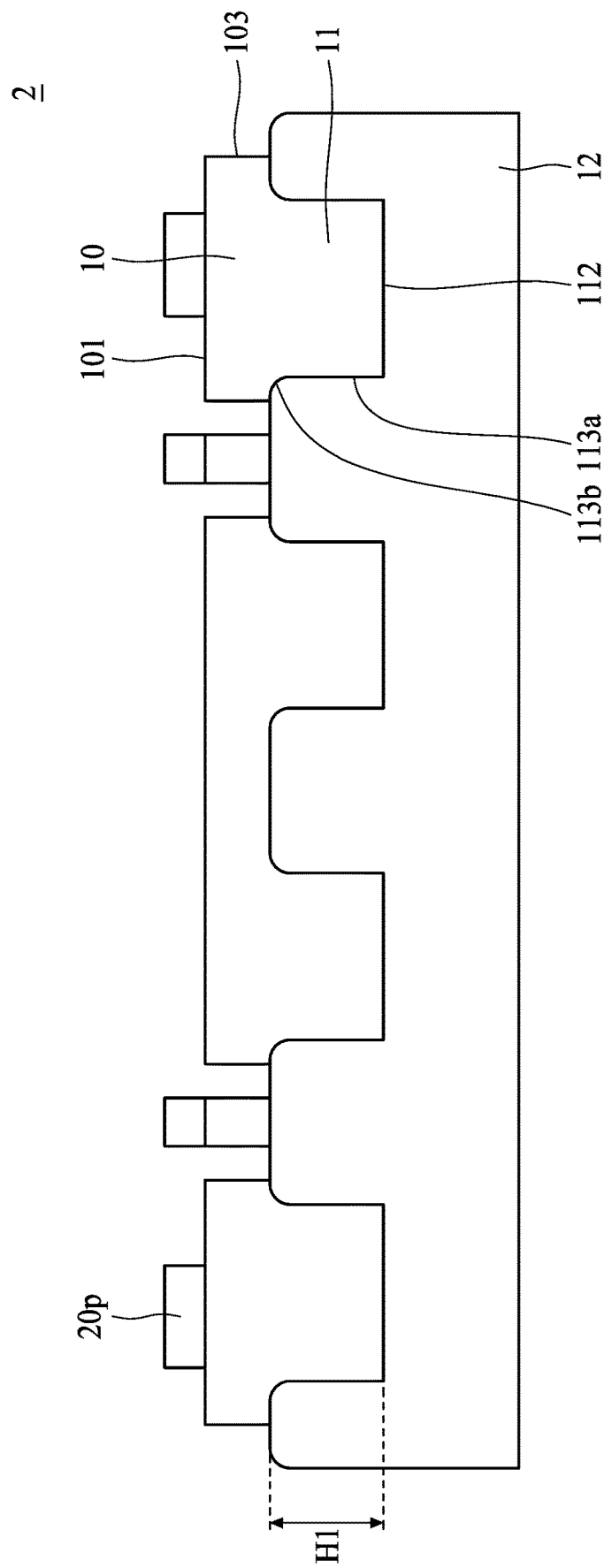
FIG. 2 illustrates a cross-sectional view of a leadframe in accordance with some embodiments of the present disclosure.

FIG. 2 illustrates a cross-sectional view of a leadframe 2 in accordance with some embodiments of the present disclosure. The leadframe 2 is similar to the leadframe 1 as shown in FIG. 1, and the differences therebetween are described below. The protection layer 10p as shown in FIG. 1 is omitted. One or more conductive pads 20p are disposed on the surface 101 of the conductive layer 10. In some embodiments, the conductive pads 20p are formed of or include gold or nickel.

Figure 3:
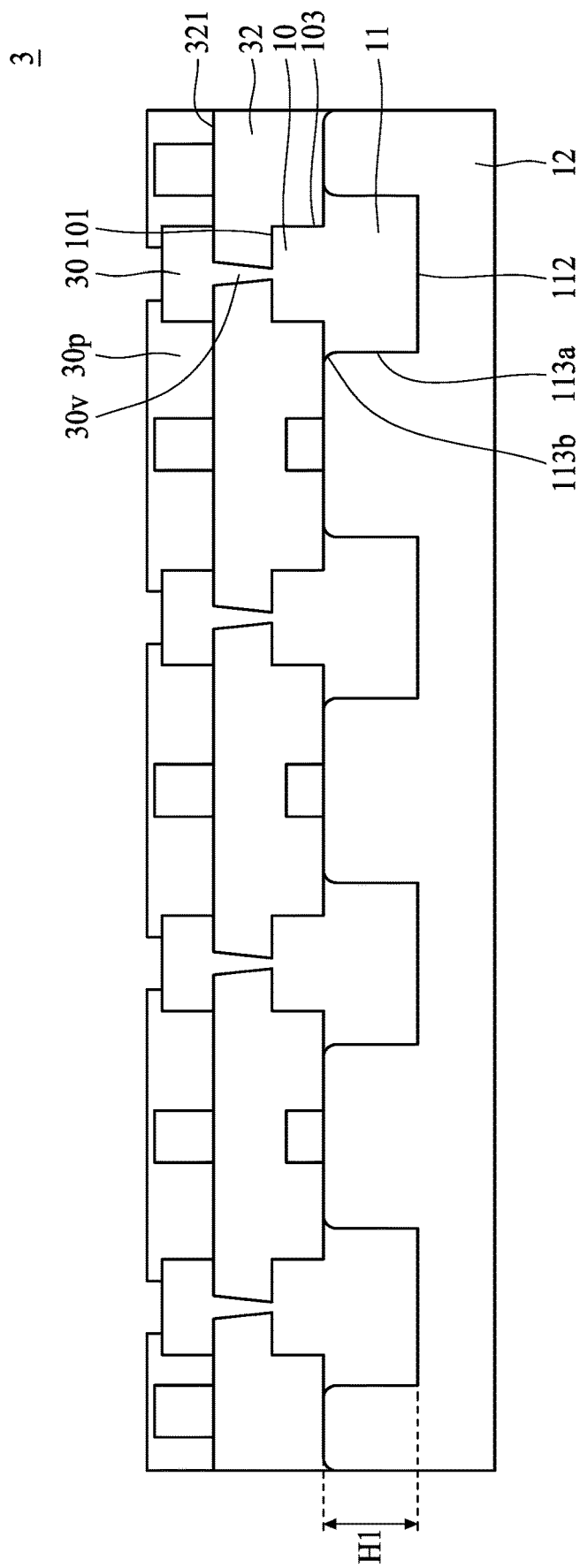
FIG. 3 illustrates a cross-sectional view of a leadframe in accordance with some embodiments of the present disclosure.

FIG. 3 illustrates a cross-sectional view of a leadframe 3 in accordance with some embodiments of the present disclosure. The leadframe 3 is similar to the leadframe 1 as shown in FIG. 1, and the differences therebetween are described below.

A package body 32 is disposed on the surface 101 of the conductive layer 10 to cover or encapsulate the conductive layer 10. In some embodiments, the package body 32 includes an epoxy resin including fillers, a molding compound (e.g., an epoxy molding compound or other molding compound), a polyimide, a phenolic compound or material, a material with a silicone dispersed therein, or a combination thereof. In some embodiments, the package body 32 includes glass fibers.

A conducive layer 30 (e.g., patterned conductive layer) is disposed on a surface 321 of the package body 32. In some embodiments, the conductive layer 30 may include the same material as the conductive layer 10. The conductive layer 30 is electrically connected to the conductive layer 10 through conductive vias 30v. A protection layer 30p (e.g., solder mask or solder resist) may cover a portion of the conductive layer 30 and expose the other portion of the conductive layer 30 for electrical connections (e.g., to provide electrical connections between an electronic component and the leadframe 3).

Figure 4:
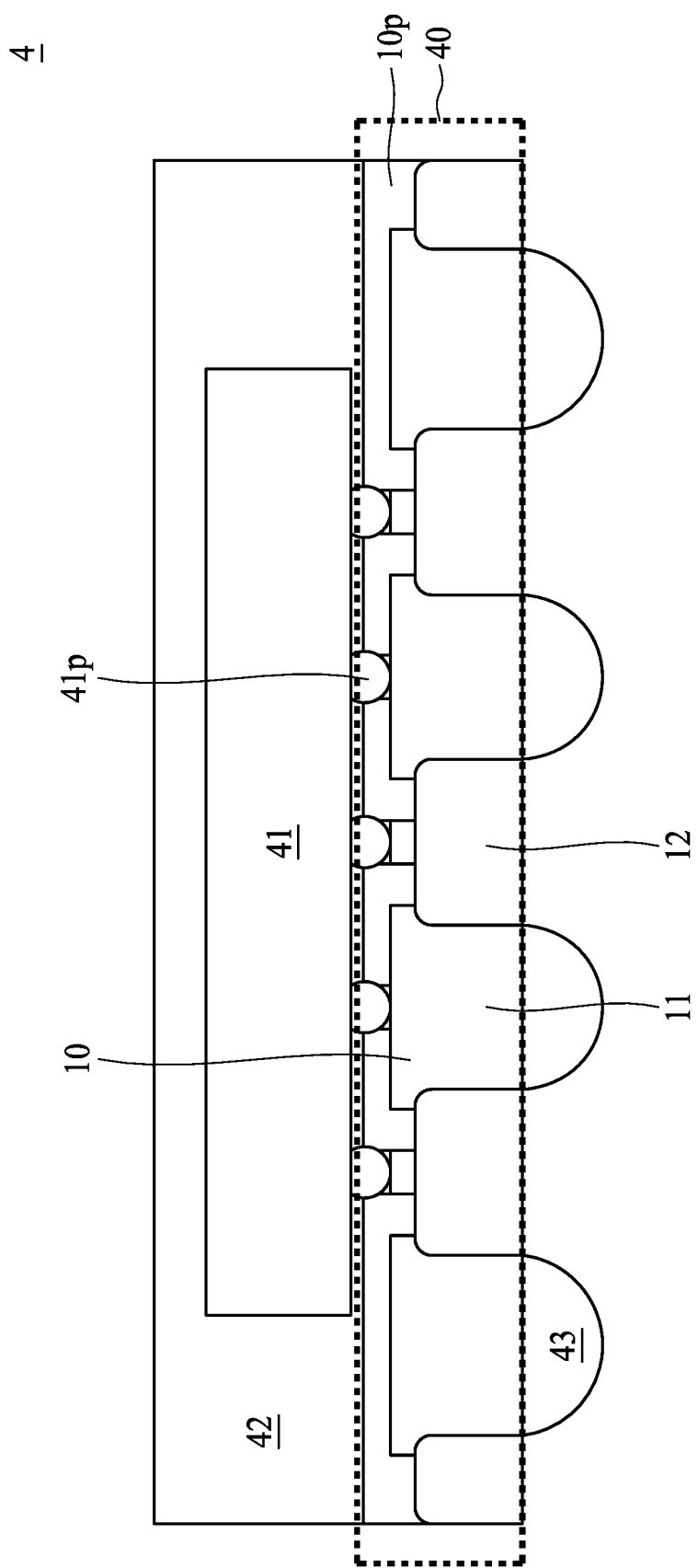
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 includes a leadframe 40, an electronic component 41, a package body 42 and electrical contacts 43.

The leadframe 40 is similar to the leadframe 1 as shown in FIG. 1, except that a portion of the package body 12 of the leadframe 40 is removed to expose the conductive pillars 12 for electrical connections. In some embodiments, the leadframe 40 can be replaced by the leadframe 3 as shown in FIG. 3 depending on different design specifications.

The electronic component 41 is disposed on the leadframe 40 and electrically connected to the conductive layer 10 exposed from the protection layer 10p through electrical contacts 41p (e.g., solder balls or micro bumps). The electronic component 41 may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof.

The package body 42 is disposed on the leadframe 40 to cover or encapsulate the electronic component 41. In some embodiments, the package body 42 includes an epoxy resin including fillers, a molding compound (e.g., an epoxy molding compound or other molding compound), a polyimide, a phenolic compound or material, a material with a silicone dispersed therein, or a combination thereof.

The electrical contact 43 (e.g. a solder ball) are disposed on the conductive pillars 11 exposed from the package body 12 and can provide electrical connections between the semiconductor package device 4 and external components (e.g. external circuits or circuit boards). In some embodiments, the electrical contact 43 includes a controlled collapse chip connection (C4) bump, a ball grid array (BGA) or a land grid array (LGA).

Figure 5:
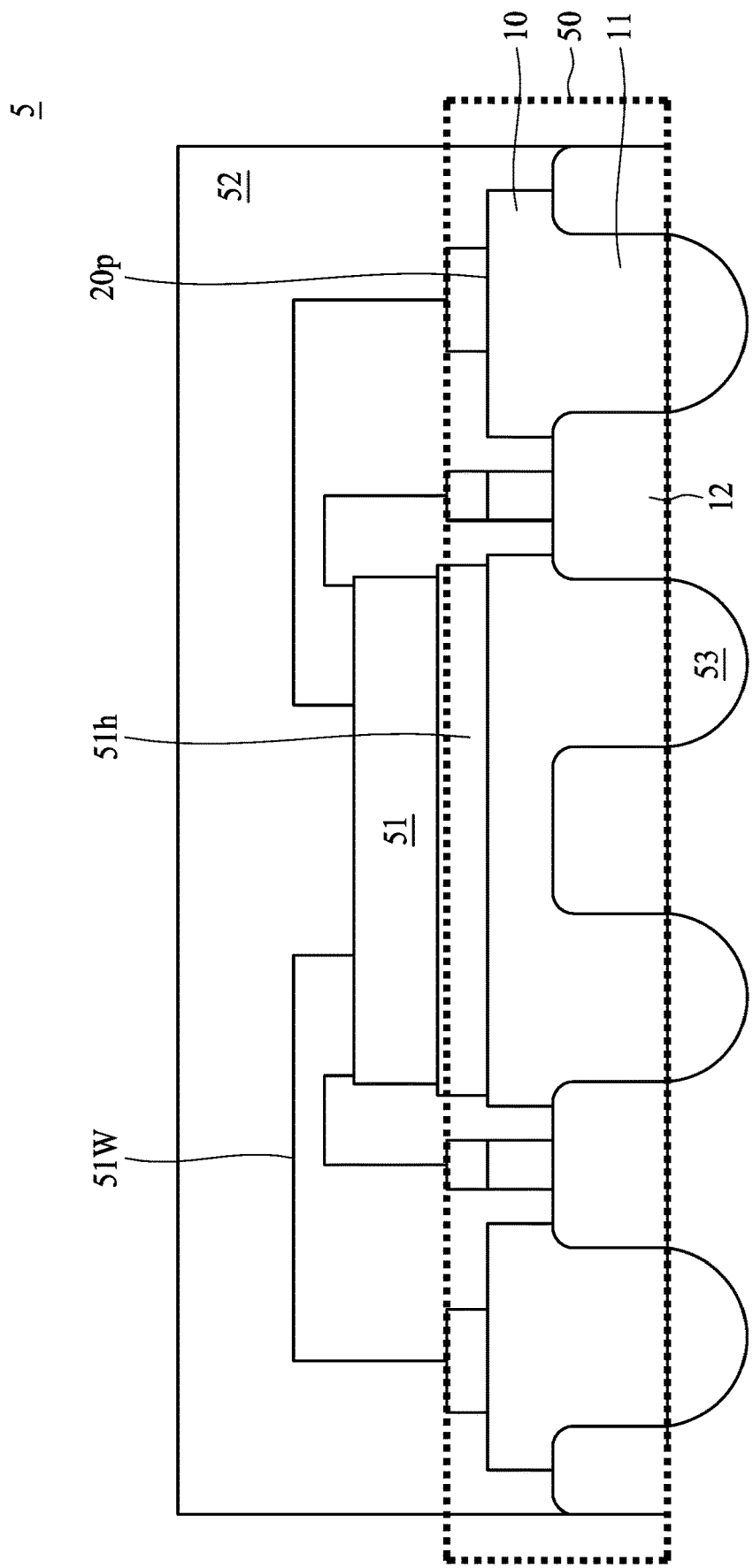
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 includes a leadframe 50, an electronic component 51, a package body 52 and electrical contacts 53.

The leadframe 50 is similar to the leadframe 2 as shown in FIG. 2, except that a portion of the package body 12 of the leadframe 50 is removed to expose the conductive pillars 12 for electrical connections.

The electronic component 51 is disposed on the leadframe 50 and electrically connected to the conductive pad 20p through conductive wires 51w. A backside surface of the electronic component 51 is connected to the conductive layer 10 through an adhesive layer 51h (e.g., a die attach film or tape). The electronic component 51 may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof.

The package body 52 is disposed on the leadframe 50 to cover or encapsulate the electronic component 51. In some embodiments, the package body 52 includes an epoxy resin including fillers, a molding compound (e.g., an epoxy molding compound or other molding compound), a polyimide, a phenolic compound or material, a material with a silicone dispersed therein, or a combination thereof.

The electrical contact 53 (e.g. a solder ball) are disposed on the conductive pillars 11 exposed from the package body 12 and can provide electrical connections between the semiconductor package device 5 and external components (e.g. external circuits or circuit boards). In some embodiments, the electrical contact 53 includes a C4 bump, a BGA or a LGA.

FIG. 6A, FIG. 6B, FIG. 6C, FIG. 6D, FIG. 6E and FIG. 6F illustrate a manufacturing process in accordance with some embodiments of the present disclosure. In some embodiments, the operations as shown in FIG. 6A, FIG. 6B, FIG. 6C, FIG. 6D, FIG. 6E and FIG. 6F can be used to manufacture the leadframe 1 as shown in FIG. 1. In other embodiments, the operations as shown in FIG. 6A, FIG. 6B, FIG. 6C, FIG. 6D, FIG. 6E and FIG. 6F can be used to manufacture any other leadframes.

Figure 6A:
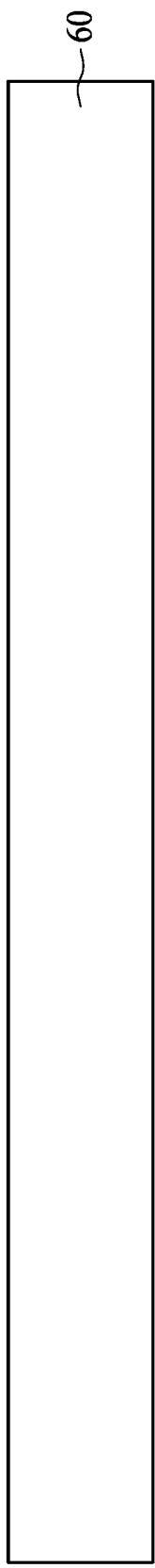
FIG. 6A, FIG. 6B, FIG. 6C, FIG. 6D, FIG. 6E and FIG. 6F illustrate a method for manufacturing a leadframe in accordance with some embodiments of the present disclosure.

Referring to FIG. 6A, a metal plate 60 is provided. The metal plate 60 is or includes, copper or a copper alloy. In some embodiments, a thickness of the metal plate 60 is from about 50 µm to about 200 µm depending on different design specifications.

Figure 6B:
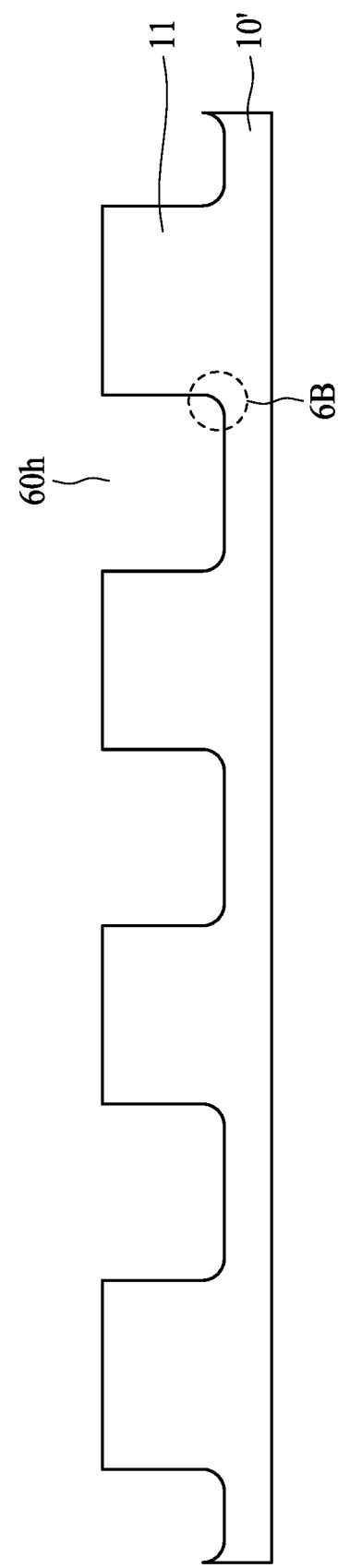

Referring to FIG. 6B, a plurality of holes 60h are formed on the metal plate 60 to define a conductive plate 10' and a plurality of conductive pillars 11. In some embodiments, the holes are formed by, for example, etching or any other suitable processes. Since the holes 60h are formed by the etching operation in accordance with some embodiments, a lower portion of sidewall of the holes 60h adjacent to the conductive plate 10' has a curved surface as encircled by a dotted-line circle 6B. In some embodiments, a depth of the holes 60h is about 40% to about 60% of the thickness of the metal plate 60, and a thickness of the conductive plate 10' is about 40% to about 60% of the thickness of the metal plate 60.

Figure 6C:
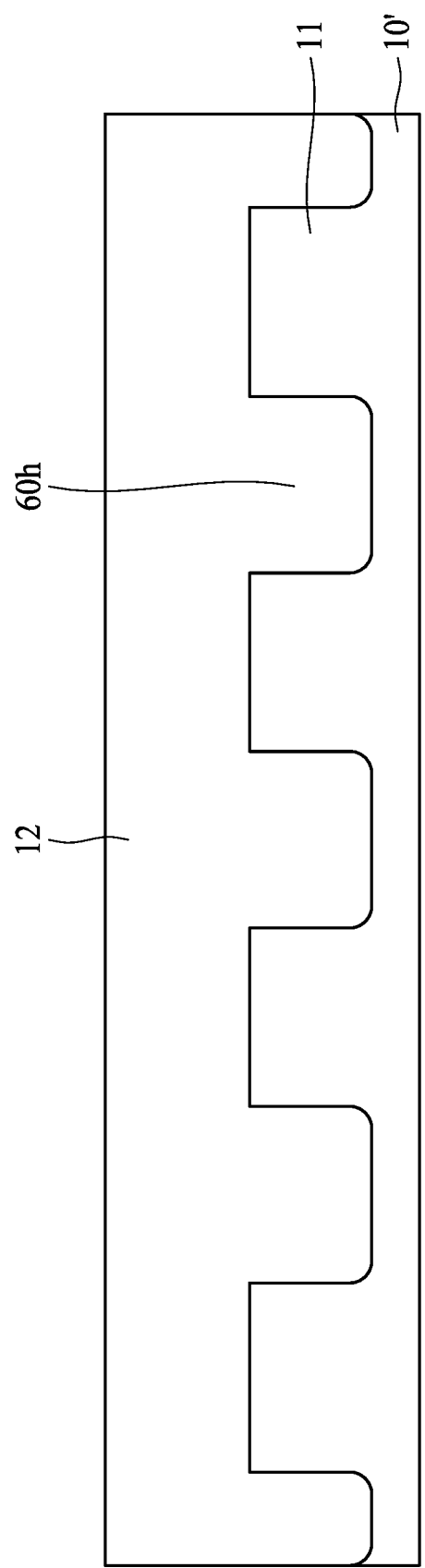

Referring to FIG. 6C, a package body 12 is formed on the conductive plate 10' and within the openings 60h to cover the conductive pillar 11. In some embodiments, the package body 12 may be formed by, for example, molding, lamination or any other suitable processes.

Figure 6D:
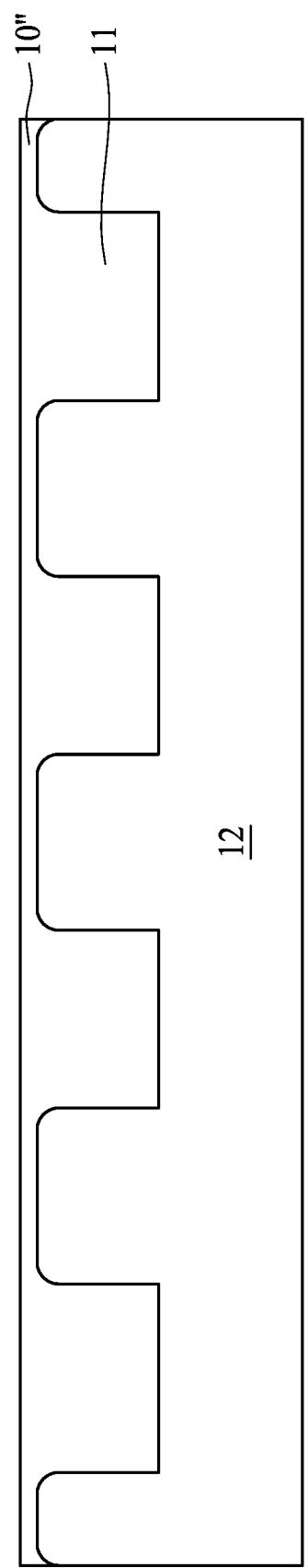

Referring to FIG. 6D, a portion of the conductive plate 10' is removed (thinned) to form a thinner conductive plate 10". In some embodiments, a thickness of the thinner conductive plate 10" is in a range from about 3 µm to 5 µm.

Figure 6E:
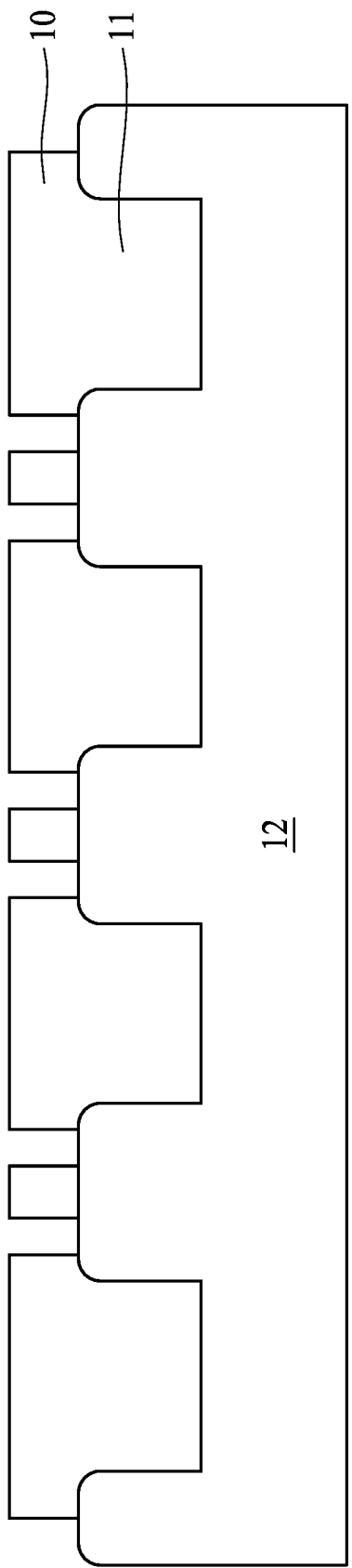

Referring to FIG. 6E, the thinner conductive plate 10" is patterned to form a conductive layer 10 (or a patterned conductive layer). In some embodiments, a flash etching operation may be carried out. In some embodiments, the operation in FIG. 6D can be omitted, and the patterning operation is directly performed on the conductive plate 10'.

Figure 6F:
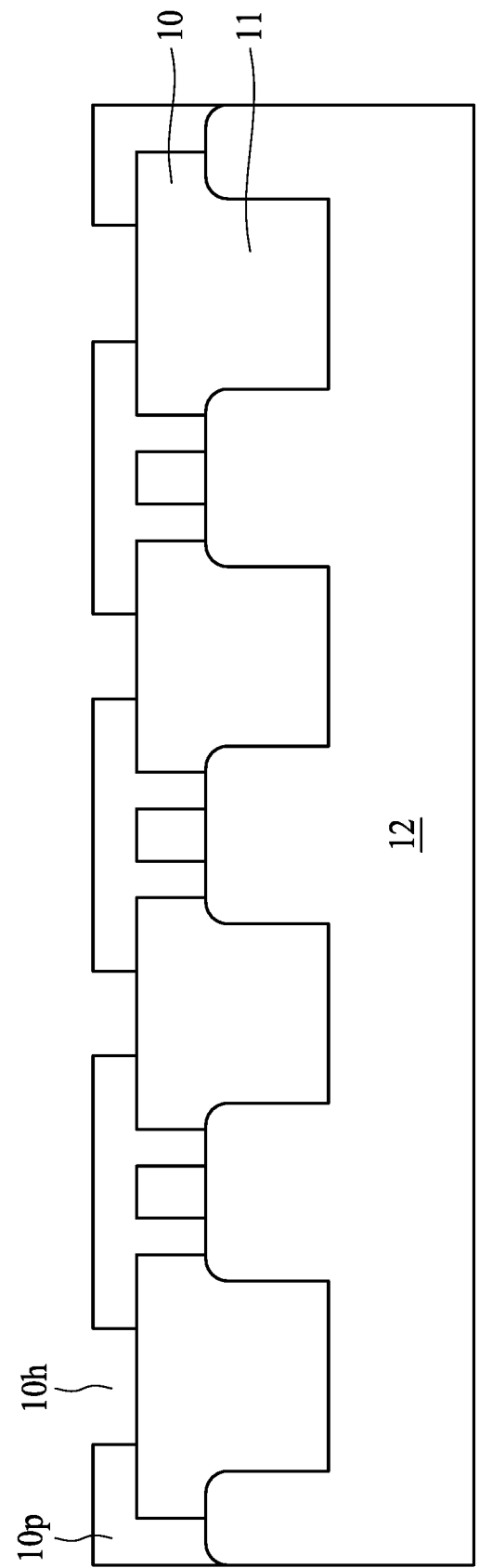

Referring to FIG. 6F, a protection layer 10p (e.g., solder resist) is formed on the package body 12 to cover the conductive layer 10. One or more openings 10h may be formed to penetrate the protection layer 10p to expose the conductive layer 10 to form the leadframe 1 as shown in FIG. 1.

Figure 7A:
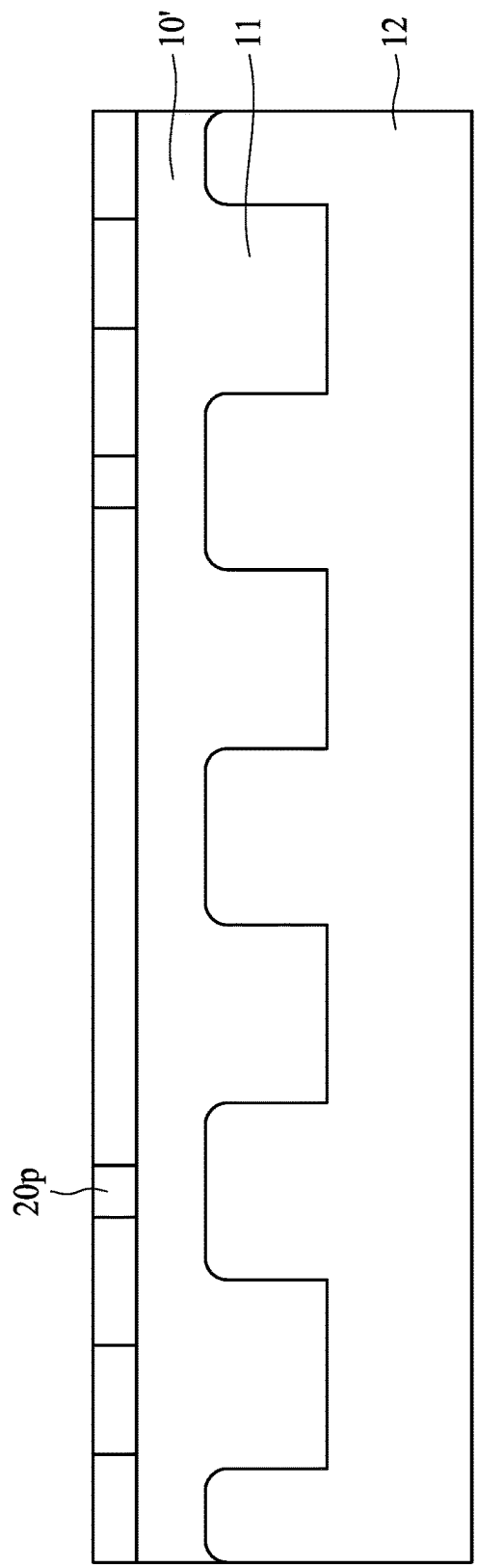
FIGS. 7A and 7B illustrate a method for manufacturing a leadframe in accordance with some embodiments of the present disclosure.
Figure 7B:
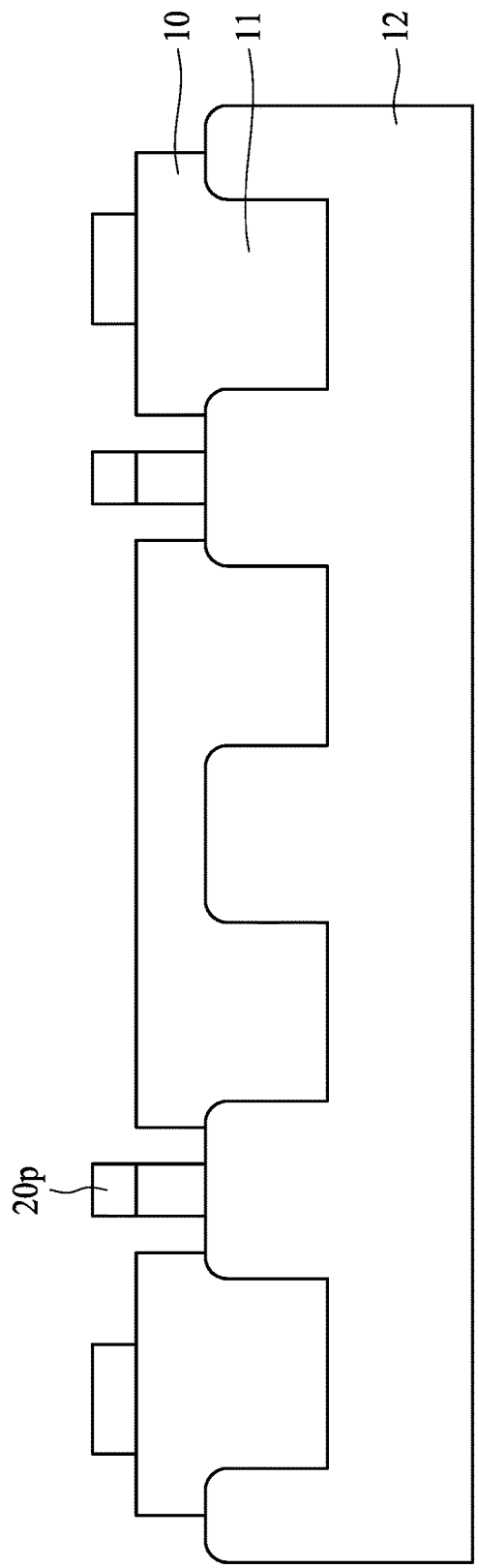

FIG. 7A and FIG. 7B illustrate a manufacturing process in accordance with some embodiments of the present disclosure. In some embodiments, the operations as shown in FIG. 7A and FIG. 7B can be used to manufacture the leadframe 2 as shown in FIG. 2. In other embodiments, the operations as shown in FIG. 7A and FIG. 7B can be used to manufacture any other leadframes. In some embodiments, the operation in FIG. 7A is carried out after the operation in FIG. 6C.

Referring to FIG. 7A, one or more conductive pads 20p are formed on the conductive plate 10' by, for example, plating or any other suitable processes. In some embodiments, the conductive pads 20p may include gold or nickel.

Referring to FIG. 7B, the conductive plate 10' is patterned to form a conductive layer 10 (or a patterned conductive layer) to form the leadframe 2 as shown in FIG. 2.

Figure 8A:
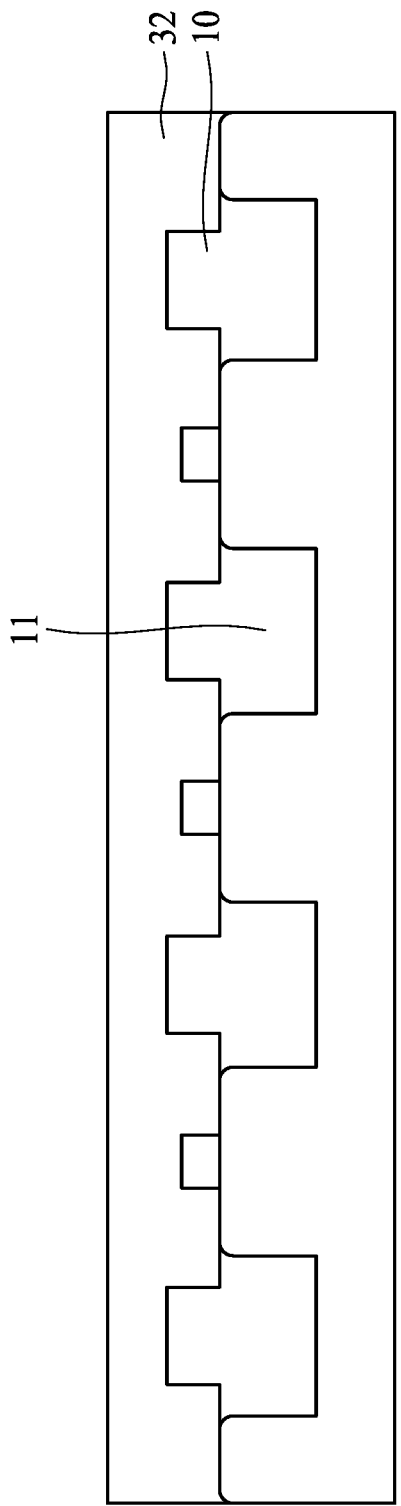
FIG. 8A, FIG. 8B, FIG. 8C and FIG. 8D illustrate a method for manufacturing a leadframe in accordance with some embodiments of the present disclosure.

FIG. 8A, FIG. 8B, FIG. 8C and FIG. 8D illustrate a manufacturing process in accordance with some embodiments of the present disclosure. In some embodiments, the operations as shown in FIG. 8A, FIG. 8B, FIG. 8C and FIG. 8D can be used to manufacture the leadframe 3 as shown in FIG. 3. In other embodiments, the operations as shown in FIG. 8A, FIG. 8B, FIG. 8C and FIG. 8D can be used to manufacture any other leadframes. In some embodiments, the operation in FIG. 8A is carried out after the operation in FIG. 6E.

Referring to FIG. 8A, a package body 32 is formed on the package body 12 to cover the conductive layer 10. In some embodiments, the package body 32 can be formed by, for example, molding, lamination or any other suitable processes.

Figure 8B:
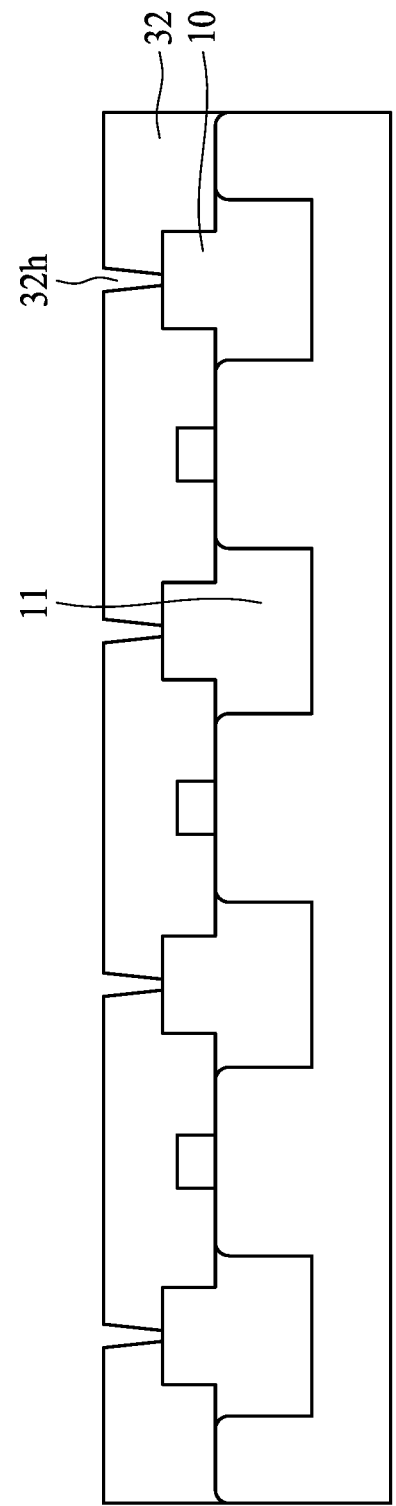

Referring to FIG. 8B, one or more openings 32h are formed to penetrate the package body 32 to expose a portion of the conductive layer 10. In some embodiments, the openings 32h are formed by, for example, laser drilling, etching or any other suitable processes.

Figure 8C:
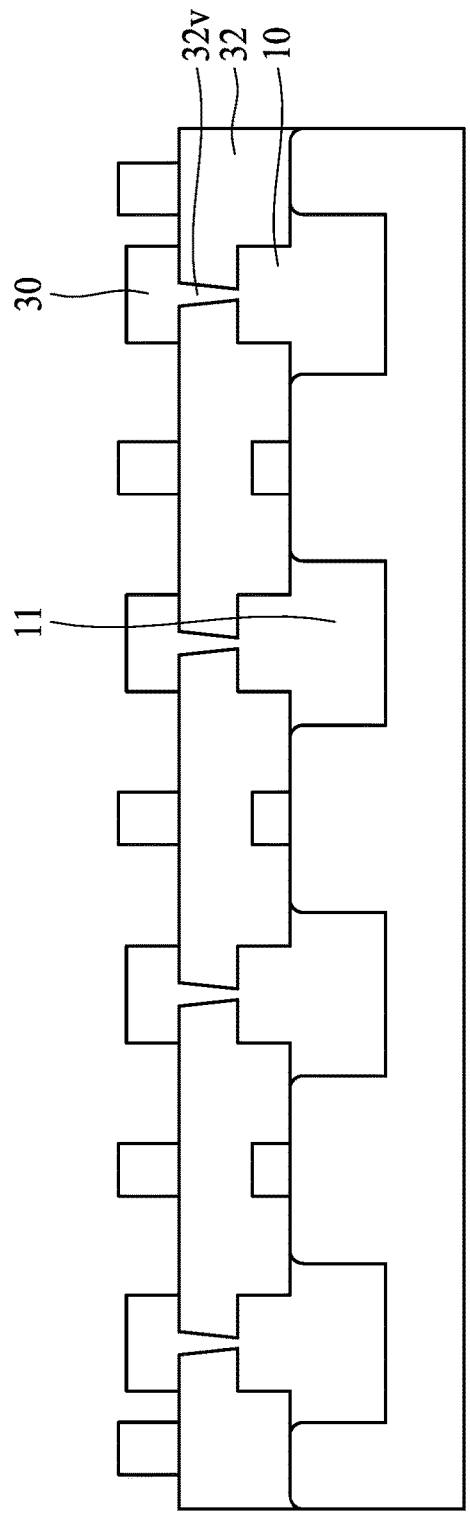

Referring to FIG. 8C, conductive vias 32v are formed within the openings 32h to electrically connect to the conductive layer 10. A patterned conductive layer 30 is formed on the package body 32 and electrically connected to the conductive vias 32.

Figure 8D:
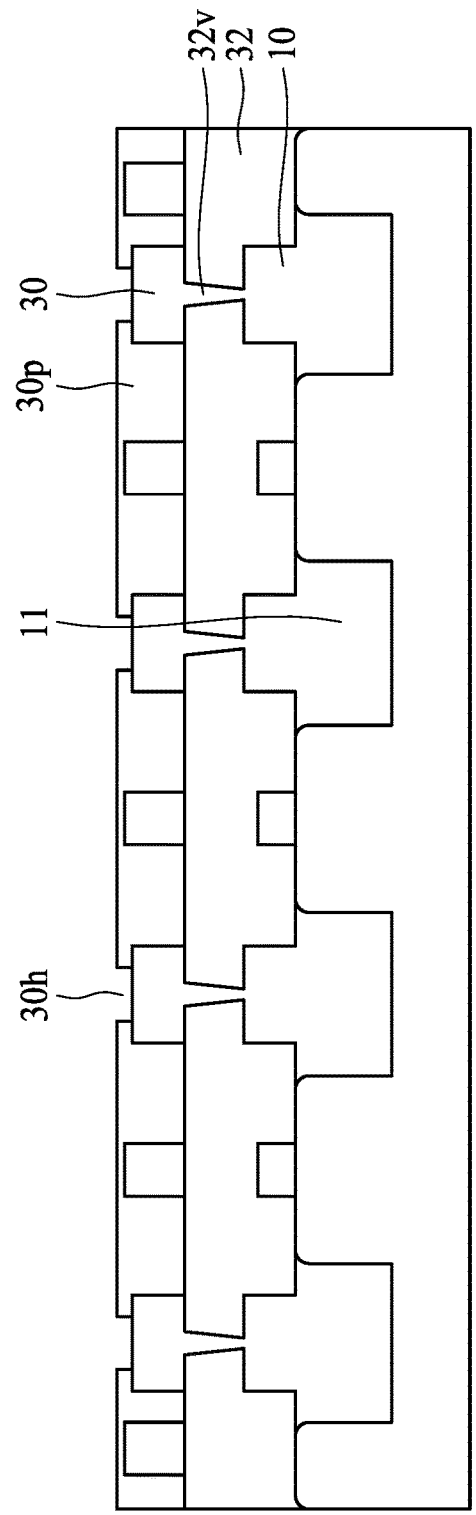

Referring to FIG. 8D, a protection layer 30p (e.g., solder resist) is formed on the package body 32 to cover the conductive layer 30. One or more openings 30h may be formed to penetrate the protection layer 30p to expose the conductive layer 30 to form the leadframe 3 as shown in FIG. 3.

FIG. 9A, FIG. 9B, FIG. 9C and FIG. 9D illustrate a manufacturing process in accordance with some embodiments of the present disclosure. In some embodiments, the operations as shown in FIG. 9A, FIG. 9B, FIG. 9C and FIG. 9D can be used to manufacture the semiconductor device package 4 as shown in FIG. 4. In other embodiments, the operations as shown in FIG. 9A, FIG. 9B, FIG. 9C and FIG. 9D can be used to manufacture any other semiconductor device packages.

Referring to FIG. 9A, the leadframe 1 as shown in FIG. 1 is provided. In some embodiments, the leadframe 1 may be replaced by the leadframe 3 as shown in FIG. 3. An electronic component 41 is placed on the leadframe 1 and electrically connected to the conductive layer 10 exposed from the protection layer 10p through electrical contacts 41p (e.g., solder balls).

Referring to FIG. 9B, a package body 42 is formed on the leadframe 1 to cover the electronic component 41. In some embodiments, the package body 42 can be formed by, for example, molding, lamination or any other suitable processes.

Figure 9C:
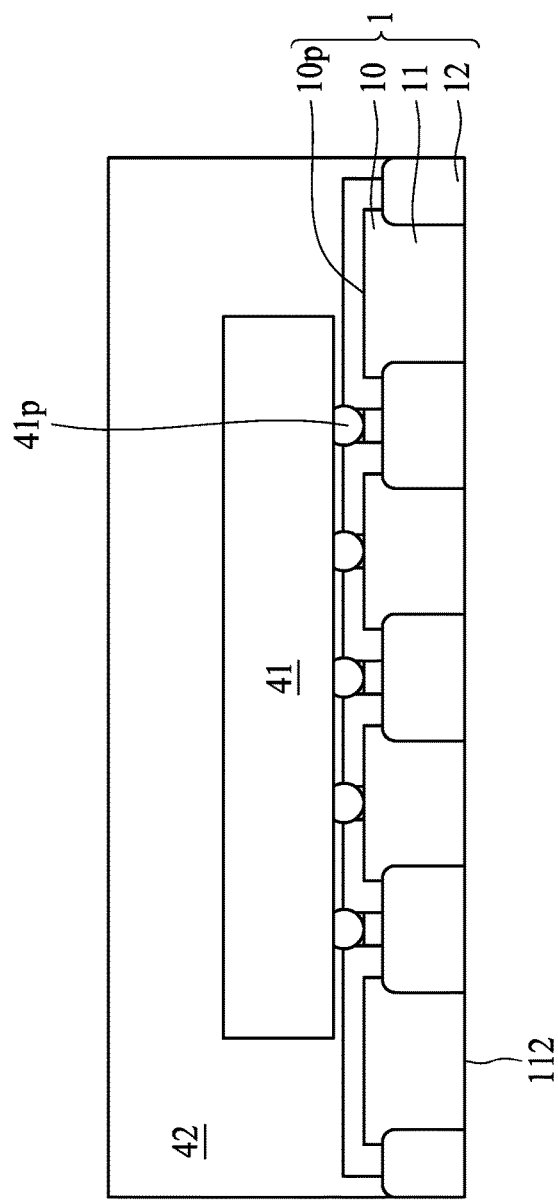

Referring to FIG. 9C, a portion of the package body 12 of the leadframe 1 is removed to expose a surface 112 of the conductive pillars 11. In some embodiments, the package body 12 can be removed by, for example, grinding or any other suitable processes.

Figure 9D:
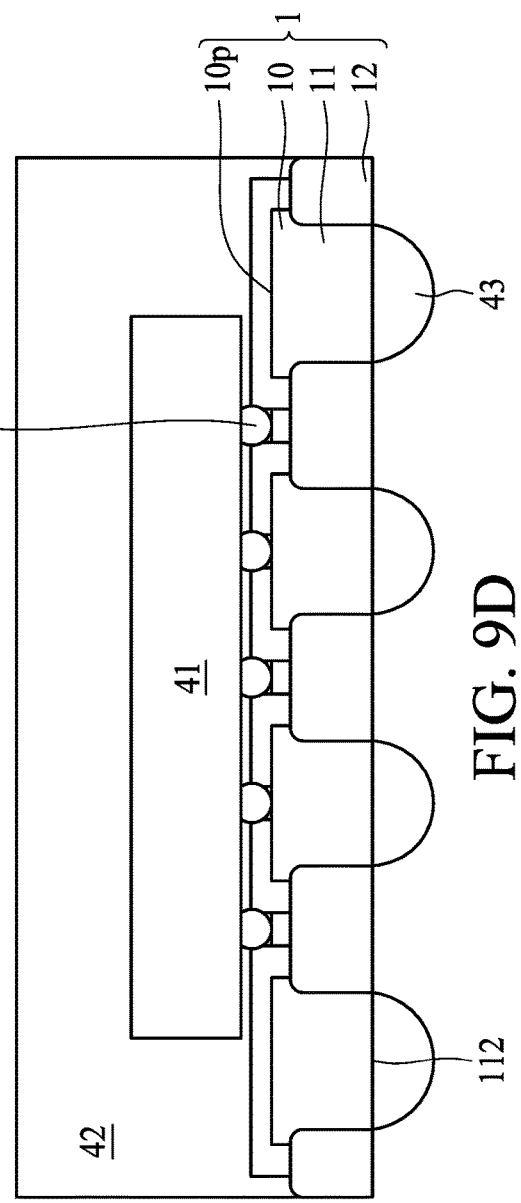

Referring to FIG. 9D, electrical contacts 43 are formed on the surface 112 of the conductive pillars 11 exposed from the package body 12 to form the semiconductor device package 4 as shown in FIG. 4.

FIG. 10A, FIG. 10B, FIG. 10C and FIG. 10D illustrate a manufacturing process in accordance with some embodiments of the present disclosure. In some embodiments, the operations as shown in FIG. 10A, FIG. 10B, FIG. 10C and FIG. 10D can be used to manufacture the semiconductor device package 5 as shown in FIG. 5. In other embodiments, the operations as shown in FIG. 10A, FIG. 10B, FIG. 10C and FIG. 10D can be used to manufacture any other semiconductor device packages.

Figure 10A:
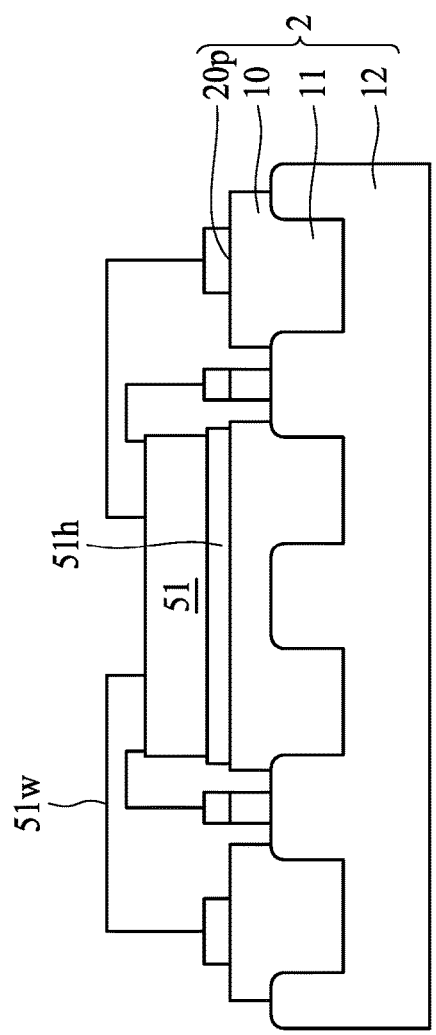
FIG. 10A, FIG. 10B, FIG. 10C and FIG. 10D illustrate a method for manufacturing a semiconductor device package in accordance with some embodiments of the present disclosure.

Referring to FIG. 10A, the leadframe 2 as shown in FIG. 2 is provided. An electronic component 51 is placed on the leadframe 2. A backside surface of the electronic component 51 is connected to the conductive layer 10 through an adhesive layer 51h. The electronic component 51 is electrically connected to the conductive pads 20p of the leadframe 2 through conductive wires 51w.

Figure 10B:
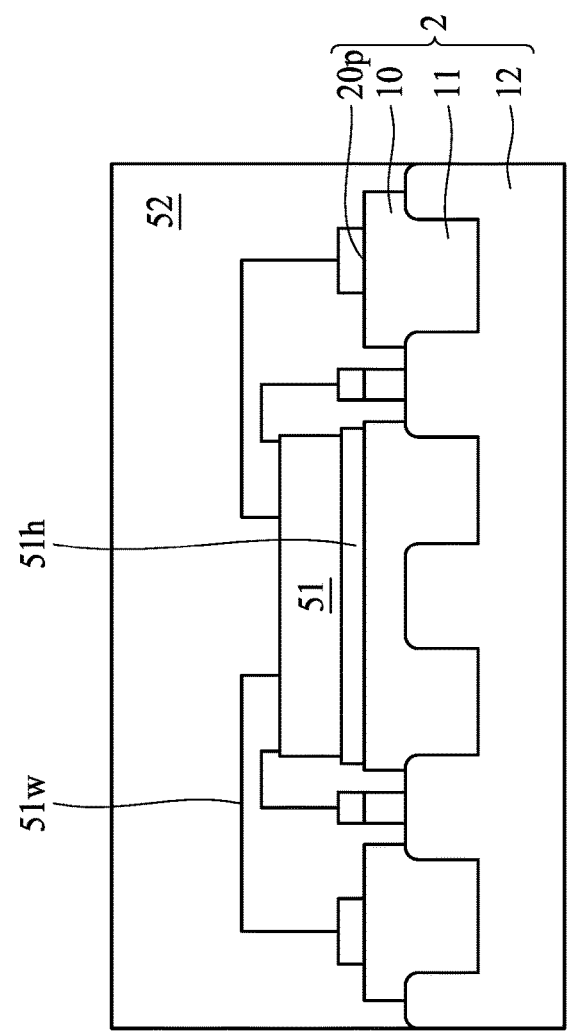

Referring to FIG. 10B, a package body 52 is formed on the leadframe 2 to cover the electronic component 51. In some embodiments, the package body 52 can be formed by, for example, molding, lamination or any other suitable processes.

Figure 10C:
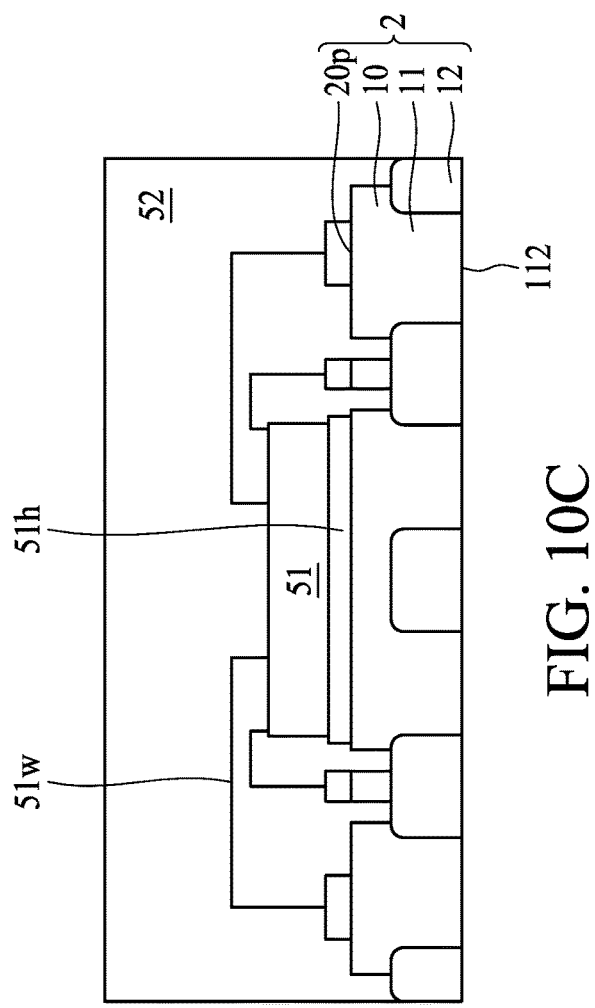

Referring to FIG. 10C, a portion of the package body 12 of the leadframe 2 is removed to expose a surface 112 of the conductive pillars 11. In some embodiments, the package body 12 can be removed by, for example, grinding or any other suitable processes.

Figure 10D:
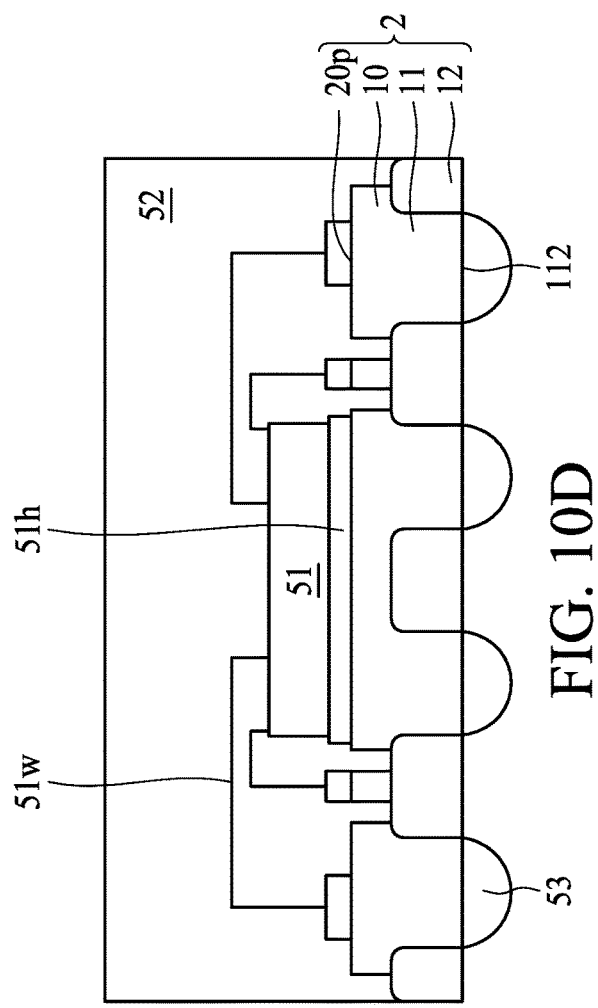

Referring to FIG. 10D, electrical contacts 53 are formed on the surface 112 of the conductive pillars 11 exposed from the package body 12 to form the semiconductor device package 5 as shown in FIG. 5.

As used herein, the terms "substantially," "substantial," "approximately," and "about" are used to denote small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" or "substantially aligned" can refer to two surfaces within micrometers (μm) of lying along the same plane, such as within 100 μm, within 80 μm, within 60 μm, within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation. The term "substantially flat" can refer to a surface roughness (Ra) of about 3 μm to about 20 μm, where a difference between a highest point and a lowest point of the surface is about 5 μm to about 10 μm. As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A leadframe, comprising:
    a first conductive layer comprising a first land and a second land, the first land having a bottom surface and a top surface opposite to the bottom surface;
    a conductive pillar disposed on the bottom surface of the first land of the first conductive layer and spaced apart from the second land of the first conductive layer; and
    a first package body covering the first conductive layer, wherein a portion of a top surface of the first land is exposed from the first package body, and a top surface of the second land is fully covered by the first package body.

2. The leadframe of claim 1, wherein a bottom surface of the second land is substantially level with the bottom surface of the first land, and a level of a top surface of the second land is lower than a level of the top surface of the first land.

3. The leadframe of claim 1, wherein a width of the second land is less than a width of the conductive pillar.

4. The leadframe of claim 1, wherein a width of the first land is less than a width of the conductive pillar.

5. A leadframe, comprising:
    a first conductive layer comprising a first land and a second land, the first land having a bottom surface and a top surface opposite to the bottom surface;
    a conductive pillar disposed on the bottom surface of the first land of the first conductive layer and spaced apart from the second land of the first conductive layer; and
    a second conductive layer disposed over the first conductive layer, wherein the second conductive layer comprises a third land electrically connected to the first land through a via and a fourth land spaced apart from the via, and a level of a top surface of the third land is lower than a level of a top surface of the fourth land.

6. The leadframe of claim 5, wherein a third thickness of the third land is less than a fourth thickness of the fourth land in a cross-sectional view.

7. The leadframe of claim 6, wherein the via has a fifth thickness between the first land and the third land, and the fifth thickness of the via is greater than the third thickness of the third land.

8. The leadframe of claim 6, wherein the via has a fifth thickness between the first land and the third land, and the fifth thickness of the via is greater than the second thickness of the second land.

9. A leadframe, comprising:
a first conductive layer comprising a first land and a second land, the first land having a bottom surface and a top surface opposite to the bottom surface;
a conductive pillar disposed on the bottom surface of the first land of the first conductive layer and spaced apart from the second land of the first conductive layer; and
a package body encapsulating the conductive pillar, wherein the package body contacts a lateral surface of the conductive pillar and completely contacts a bottom surface of the conductive pillar.

10. The leadframe of claim 9, wherein the package body is configured to serve as an etching stop layer for patterning the first conductive layer.

11. A leadframe, comprising:
a first conductive layer comprising a first land and a second land, the first land having a bottom surface and a top surface opposite to the bottom surface;
a conductive pillar disposed on the bottom surface of the first land of the first conductive layer and spaced apart from the second land of the first conductive layer;
a first package body covering the first conductive layer, wherein a portion of a top surface of the first land is exposed from the first package body, and a top surface of the second land is fully covered by the first package body;
a second package body encapsulating the conductive pillar, wherein the second package body contacts a lateral surface of the conductive pillar and completely contacts a bottom surface of the conductive pillar; and
a second conductive layer disposed over the first conductive layer, wherein the second conductive layer comprises a third land electrically connected to the first land through a via and a fourth land spaced apart from the via, and a level of a top surface of the third land is lower than a level of a top surface of the fourth land.

* * * * *